(12) United States Patent
Kim et al.

(10) Patent No.: US 8,841,666 B2
(45) Date of Patent: Sep. 23, 2014

(54) DISPLAY DEVICE

(71) Applicant: Samsung Display Co., Ltd, Yongin (KR)

(72) Inventors: Jeong-Hwan Kim, Yongin (KR); Kyung-Hye Kim, Yongin (KR); Joo-Sun Yoon, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 14/055,607

(22) Filed: Oct. 16, 2013

(65) Prior Publication Data

US 2014/0139772 A1    May 22, 2014

(30) Foreign Application Priority Data

Nov. 20, 2012 (KR) .................. 10-2012-0131868

(51) Int. Cl.
*H01L 29/10* (2006.01)
*H01L 29/12* (2006.01)
*H01L 27/32* (2006.01)

(52) U.S. Cl.
CPC .................... *H01L 27/3244* (2013.01)
USPC ..................... 257/43; 257/E51.022

(58) Field of Classification Search
USPC ............................ 257/43, E51.022
See application file for complete search history.

(56) References Cited

U.S. PATENT DOCUMENTS

| | | | |
|---|---|---|---|
| 2010/0207117 A1* | 8/2010 | Sakata et al. | 257/43 |
| 2011/0012118 A1* | 1/2011 | Yamazaki et al. | 257/59 |
| 2011/0147733 A1* | 6/2011 | Kao et al. | 257/43 |
| 2011/0180802 A1 | 7/2011 | Morosawa et al. | |
| 2012/0223307 A1* | 9/2012 | Sakata | 257/43 |
| 2012/0223308 A1* | 9/2012 | Okabe et al. | 257/43 |
| 2013/0264563 A1* | 10/2013 | Okazaki et al. | 257/43 |
| 2014/0014948 A1* | 1/2014 | Matsukura | 257/43 |

FOREIGN PATENT DOCUMENTS

| | | |
|---|---|---|
| JP | 2796049 B2 | 6/1998 |
| KR | 10-0574534 B1 | 4/2006 |
| KR | 10-2010-0021885 A | 2/2010 |
| KR | 10-2011-0069042 A | 6/2011 |

OTHER PUBLICATIONS

T. Arai et al., "69.2: Highly Reliable Oxide-Semiconductor TFT for AM-OLED Display," *SID '10 Digest*, pp. 1033-1036 (2010).

* cited by examiner

*Primary Examiner* — Matthew W Such
*Assistant Examiner* — Samuel Lair
(74) *Attorney, Agent, or Firm* — Knobbe Martens Olson & Bear LLP

(57) ABSTRACT

In an aspect, a display device including: a substrate; a thin film transistor formed on the substrate, and comprising an active layer formed of an oxide semiconductor; a passivation layer formed on the thin film transistor; and a hydrogen blocking layer positioned between the active layer and the passivation layer is provided.

20 Claims, 19 Drawing Sheets

700

DISPLAY DEVICE

INCORPORATION BY REFERENCE TO ANY PRIORITY APPLICATIONS

Any and all priority claims identified in the Application Data Sheet, or any correction thereto, are hereby incorporated by reference under 37 CFR 1.57. For example, this application claims priority to and the benefit of Korean Patent Application No. 10-2012-0131868, filed on Nov. 20, 2012 in the Korean Intellectual Property Office, the disclosure of which is incorporated herein by reference in its entirety.

BACKGROUND

1. Field

The described technology relates generally to a display device, and more particularly, to a display device including a thin film transistor which uses an oxide semiconductor as an active layer.

2. Description of the Related Technology

A thin film transistor may be used as a pixel switching element of a flat panel display. An active layer of the thin film transistor may be mainly formed of amorphous silicon or polycrystalline silicon. The amorphous silicon active layer may be easily deposited on a large area and processed at a low temperature, but has a drawback of low charge mobility. The polycrystalline silicon active layer has excellent electrical characteristic due to high charge mobility, but demands a high temperature process and has difficulty in reliable uniformity.

A thin film transistor including an oxide semiconductor (for example, zinc oxide or gallium-indium-zinc oxide) as the active layer has both of an advantage of amorphous silicon capable of being processed at a low temperature and an advantage of polycrystalline silicon having high charge mobility. However, a component characteristic of the oxide semiconductor active layer may deteriorate by coming in contact with gas containing hydrogen that may be used in a subsequent passivation process.

Particularly, a passivation layer formed of a silicon nitride layer or a silicon oxide layer may be located on the thin film transistor. The passivation layer may be formed by CVD or PECVD, and during the process, gas, such as $SiH_4$ and $NH_3$, containing a large amount of hydrogen may be used. The hydrogen contained in the gas flows through the active layer, so that an initial characteristic and long-term reliability of the thin film transistor may deteriorate.

The above information disclosed in this Background section is only for enhancement of understanding of the background of the described technology and therefore it may contain information that does not form the prior art that is already known to a person of ordinary skill in the art.

SUMMARY

Some embodiments provide a display device having advantages of suppressing deterioration of an electrical characteristic of a thin film transistor by preventing hydrogen from flowing in an active layer during a process of depositing a passivation layer.

Some embodiments provide a display device, including: a substrate; a tin film transistor, a passivation layer, and a hydrogen blocking layer. In some embodiments, the thin film transistor may be formed on the substrate, and include an active layer formed of an oxide semiconductor. In some embodiments, the passivation layer may be formed on the thin film transistor. In some embodiments, the hydrogen blocking layer may be positioned between the active layer and the passivation layer, and include at least one selected from the group consisting of aluminum-neodymium (AlNd) oxide, aluminum-nickel-lanthanum (AlNiLa) oxide, aluminum-nickel-germanium-lanthanum (AlNiGeLa) oxide, and aluminum-cobalt-germanium-lanthanum (AlCoGeLa) oxide.

In some embodiments, the active layer may include at least one of oxide including titanium (Ti), hafnium (Hf), zirconium (Zr), aluminum (Al), tantalum (Ta), germanium (Ge), zinc (Zn), gallium (Ga), tin (Sn), or indium (In) and complex oxide thereof. In some embodiments, the active layer may have a thickness of 40 Å to 500 Å.

In some embodiments, the thin film transistor may include a gate electrode, and source/drain electrodes positioned on the gate electrode with a gate insulating layer interposed therebetween, and the active layer is positioned between the source electrodes and the drain electrodes on the gate insulating layer. In some embodiments, an etching stopping layer may be positioned on the active layer and the source/drain electrodes, and the passivation layer is positioned on the etching stopping layer.

In some embodiments, the hydrogen blocking layer may be positioned between the etching stopping layer and the passivation layer. In some embodiments, the hydrogen blocking layer may be directly positioned on the active layer and the source/drain electrodes. In some embodiments, the hydrogen blocking layer may include: a first hydrogen blocking layer positioned between the etching stopping layer and the passivation layer; and a second hydrogen blocking layer directly positioned on the active layer and the source/drain electrodes. In some embodiments, the etching stopping layer may include silicon oxide, and the passivation layer may include silicon nitride.

In some embodiments, the display device may further include: a pixel electrode connected to the thin film transistor; a second substrate disposed opposite to the substrate; a common electrode formed on one surface of the second substrate facing the substrate; and a liquid crystal layer positioned between the pixel electrode and the common electrode.

In some embodiments, the thin film transistor may include a gate electrode and source/drain electrodes, and the active layer may be positioned on a gate insulating layer covering the gate electrode and an etching stopping layer may be positioned on the active layer. In some embodiments, the source/drain electrodes may be positioned on the etching stopping layer, and are connected to the active layer through a via hole formed in the etching stopping layer. In some embodiments, the passivation layer may be positioned on the source/drain electrodes.

In some embodiments, the hydrogen blocking layer may be positioned between the source/drain electrodes and the passivation layer. In some embodiments, the hydrogen blocking layer may include: a first hydrogen blocking layer positioned on the source/drain electrodes and the passivation layer; and a second hydrogen blocking layer positioned between the etching stopping layer and the source/drain electrodes, and is formed with a via hole together with the etching stopping layer.

In some embodiments, the hydrogen blocking layer may be positioned between the active layer and the etching stopping layer, and may be formed with a via hole together with the etching stopping layer. In some embodiments, the hydrogen blocking layer may include: a first hydrogen blocking layer positioned between the source/drain electrodes and the passivation layer; and a second hydrogen blocking layer positioned between the active layer and the etching stopping layer, and is formed with a via hole together with the etching stopping layer. In some embodiments, the etching stopping layer and the passivation layer may include silicon oxide.

In some embodiments, the display device may further include: an organic light emitting diode; and an encapsulation member configured to seal the organic light emitting diode. In some embodiments, the organic light emitting diode may include a pixel electrode connected with the thin film transistor, an organic emission layer formed on the pixel electrode, and a common electrode formed on the organic emission layer.

In some embodiments, the substrate and the encapsulation member may have a bending property. In some embodiments, the substrate and the encapsulation member may be flexible. In some embodiments, the organic emission layer may include all of a red organic emission layer, a green organic emission layer, and a blue organic emission layer, or include a white organic emission layer.

In some embodiments, the hydrogen blocking layer blocks hydrogen diffused from the passivation layer, thereby suppressing characteristic deterioration of the active layer. Accordingly, it is possible to suppress a phenomenon of excessive exhibition of an initial characteristic of the thin film transistor by flow of the hydrogen in the active layer, and decrease a quantity of change in an initial threshold voltage Vth after the thin film transistor is manufactured. Further, it is possible to stabilize an electrical characteristic of the thin film transistor by suppressing a change in a charge concentration of the active layer.

DETAILED DESCRIPTION

Hereinafter, the present disclosure will be described more fully hereinafter with reference to the accompanying drawings, in which exemplary embodiments of this disclosure are shown. This disclosure may, however, may be embodied in many different forms all without departing from the spirit or scope of the present embodiments.

Throughout this specification, unless explicitly described to the contrary, the word "comprise" and variations such as "comprises" or "comprising", will be understood to imply the inclusion of stated elements. Further, through the specification, it will be understood that when an element such as a layer, film, region, or substrate is referred to as being "on" another element, it can be directly on the other element or intervening elements may also be present. In addition, in the specification, the word "on" means positioning on or below the object portion, for example as depicted in the Figures, and does not necessarily mean positioning on the upper side of the object portion based on a gravity direction.

Figure 1:
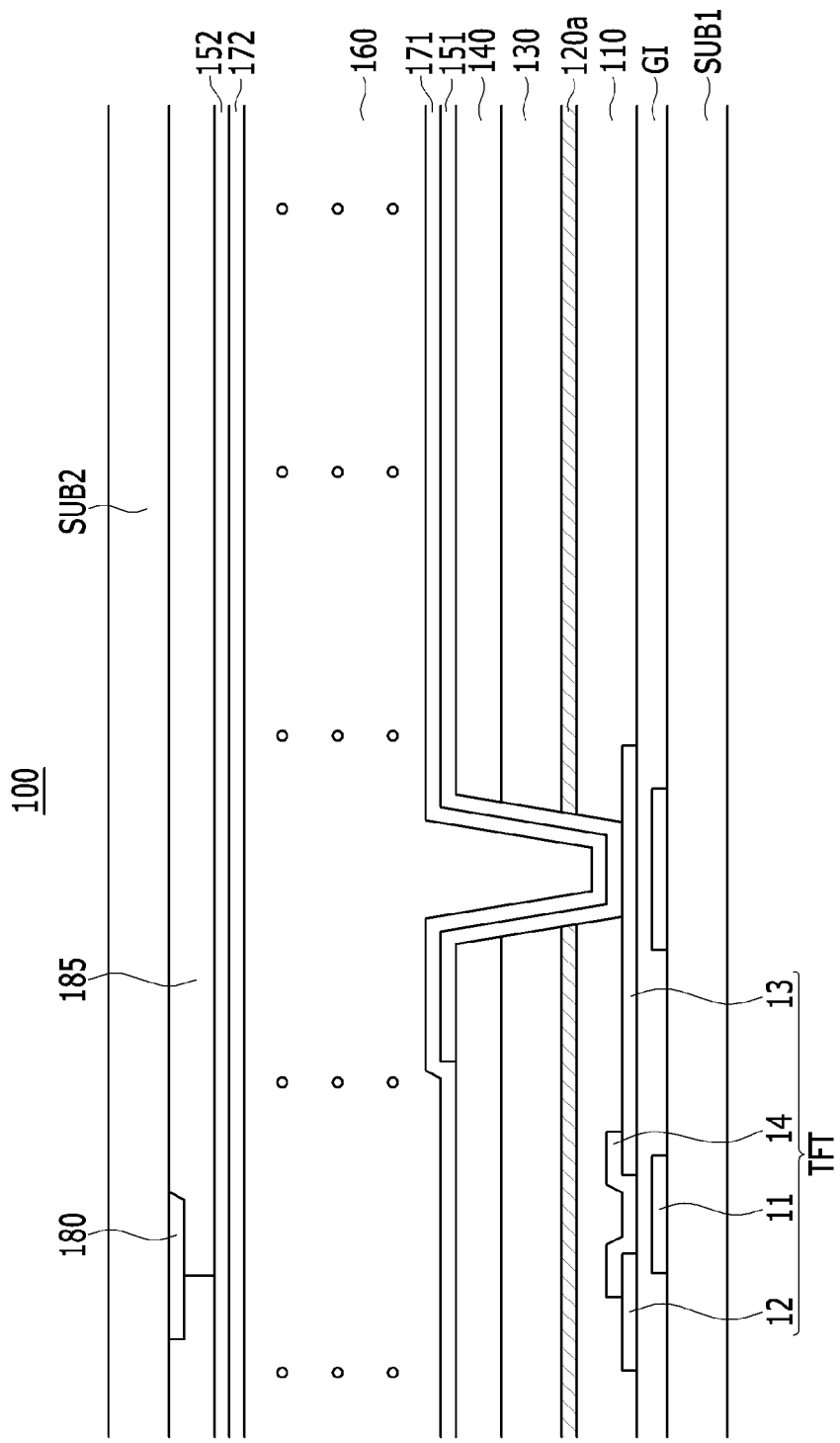
FIG. 1 is a cross-sectional view of a display device according to an embodiment.

FIG. 1 is a cross-sectional view of a display device according to a first exemplary embodiment.

Referring to FIG. 1, a display device 100 of the first exemplary embodiment includes a first substrate SU1, a thin film transistor TFT, a hydrogen blocking layer 120a, and a passivation layer 130. In some aspects, the display device 100 of the first exemplary embodiment may be a liquid crystal display, and further includes a pixel electrode 151, a liquid crystal layer 160, a common electrode 152, and a second substrate SUB2. FIG. 1 illustrates one pixel area.

In some aspects, the first substrate SUB1 may be formed of an insulation substrate, such as glass or plastic. In some aspects, the thin film transistor TFT may include a gate electrode 11, a source electrode 12, a drain electrode 13, and an active layer 14 connected to the source/drain electrodes 12 and 13 as shown in FIG. 1. In some aspects, a gate insulating layer GI may be positioned between the gate electrode 11 and the source/drain electrodes 12 and 13, and an etching stopping layer 110 and the passivation layer 130 are positioned on the source/drain electrodes 12 and 13 and the active layer 14 as shown in FIG. 1.

In some aspects, the gate electrode 11 may be positioned on the first substrate SUB1, and the gate insulating layer GI may be positioned on the first substrate SUB1 so as to cover the gate electrode 11 as shown in FIG. 1.

In some aspects, the source electrode 12 and the drain electrode 13 may be positioned on the gate insulating layer GI while having a space therebetween, and the active layer 14 may be positioned between the two electrodes 12 and 13 while being in contact with the source electrode 12 and the drain electrode 13 as shown in FIG. 1.

In some aspects, the gate electrode 11 functions to control an electron density of the active layer 14 by a gate voltage applied to the thin film transistor TFT. In some aspects, the gate electrode 11 may be formed of a double layer of molybdenum (Mo) and aluminum (Al) or a double layer of an alloy of molybdenum (Mo) and aluminum (Al). In some aspects, the source/drain electrodes 12 and 13 may include at least one of chromium (Cr), molybdenum (Mo), aluminum (Al), copper (Cu), neodymium (Nd), tungsten (W), or titanium (Ti), or may include a transparent conductive layer, such as indium-tin oxide (ITO).

In some aspects, the source/drain electrodes 12 and 13 are first formed on the gate insulating layer GI before the active layer 14, or the active layer 14 may be formed before the source/drain electrodes 12 and 13.

In some aspects, the active layer 14 includes an oxide semiconductor. In some aspects, the oxide semiconductor may at least one of oxide based on titanium (Ti), hafnium (Hf), zirconium (Zr), aluminum (Al), tantalum (Ta), germanium (Ge), zinc (Zn), gallium (Ga), tin (Sn), or indium (In), and complex oxide thereof, such as indium-gallium-zinc oxide (In—Ga—Zn—O), indium-zinc oxide (In—Zn—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O).

In some aspects, the active layer 14 may be formed by a method, such as metal organic chemical vapor deposition (MOCVD), chemical vapor deposition CVD, sputter deposition, and E-beam deposition. Among them, in a case of the metal organic chemical vapor deposition (MOCVD), a deposition temperature may be maintained at 300° C. or lower, thereby decreasing thermal stress applied to the first substrate SUB1 during the deposition.

In some aspects, the active layer 14 formed of an oxide semiconductor exhibits excellent semiconductor characteristic, but is vulnerable to an outside environment. Accordingly, in some aspects, the etching stopping layer 110, the hydrogen blocking layer 120a, and the passivation layer 130 are sequentially positioned on the active layer 14 to protect the active layer 14 from the outside environment containing moisture and oxygen. In some aspects, the etching stopping layer 110 may include silicon oxide, and the passivation layer 130 may include silicon nitride.

In some aspects, the hydrogen blocking layer 120a includes at least one of aluminum-neodymium (AlNd) oxide, aluminum-nickel-lanthanum (AlNiLa) oxide, aluminum-nickel-germanium-lanthanum (AlNiGeLa) oxide, and aluminum-cobalt-germanium-lanthanum (AlCoGeLa) oxide.

In some aspects, the hydrogen blocking layer 120a is positioned between the active layer 14 and the passivation layer 130, and particularly, is positioned between the etching stopping layer 110 and the passivation layer 130 as shown in FIG. 1. In some aspects, the hydrogen blocking layer 120a blocks hydrogen contained in the gas used in a process of depositing a material forming the passivation layer 130 from flowing in the active layer 14. In some aspects, hydrogen deteriorates an electrical characteristic of the active layer 14 by reacting with the active layer 14.

In some aspects, the hydrogen blocking layer 120a has a refractive index of about 1.6 to 1.7, and exhibits a high layer density compared to the etching stopping layer 110. Accordingly, in some aspects, the hydrogen blocking layer 120 effectively blocks the hydrogen diffused from the passivation layer 130 to suppress characteristic deterioration of the active layer 14.

As a result, the display device 100 as shown in FIG. 1 may suppress an initial characteristic excessive exhibition phenomenon of the thin film transistor TFT by the flow of the hydrogen in the active layer 14. Further, it is possible to decrease a quantity of change of an initial threshold voltage Vth after the thin film transistor TFT is manufactured, and improve long-term reliability of the thin film transistor TFT.

In some aspects, the hydrogen blocking layer 120a as shown in FIG. 1 has a high gas barrier characteristic, so that it is possible to suppress the change of a charge concentration of the active layer 14 by suppressing oxygen, and the like, from being separated from the active layer 14. Accordingly, it is possible to stabilize an electric characteristic of the thin film transistor TFT.

In some aspects, the hydrogen blocking layer 120a does not generate hydrogen during the deposition process. In some aspects, the hydrogen blocking layer 120a may be formed by a method, such as DC sputtering, chemical vapor deposition (CVD), plasma enhanced chemical vapor deposition (PECVD), metal organic chemical vapor deposition (MOCVD), or atomic layer deposition (ALD).

In some aspects, the hydrogen blocking layer 120a may be formed in a thickness of 40 Å to 500 Å. When the thickness of the hydrogen blocking layer 120a is smaller than 40 Å, the hydrogen blocking layer 120a cannot secure a sufficient physical thickness, so that hydrogen blocking capability deteriorates. As the thickness of the hydrogen blocking layer 120a is increased, a hydrogen blocking effect may be improved, but a deposition time is increased. When the thickness of the hydrogen blocking layer 120a is larger than 500 Å, the process is delayed due to an excessive deposition time, thereby being disadvantageous to mass production.

In some aspects, an organic passivation layer 140 may be positioned on the passivation layer 130, and the pixel electrode 151 is positioned on the organic passivation layer 140. In some aspects, the pixel electrode 151 may be in contact with the drain electrode 13 through a via hole formed in the organic passivation layer 140, the passivation layer 130, the hydrogen blocking layer 120a, and the etching stopping layer 110 as shown in FIG. 1. One pixel electrode 151 may be included for each pixel, and a lower alignment layer 171 is positioned on the pixel electrode 151 and the organic passivation layer 140 as shown in FIG. 1.

In some aspects, a light blocking layer 180 and a color filter 185 are positioned on one surface of the second substrate SUB2 facing the first substrate SUB1 as shown in FIG. 1. In some aspects, the color filter 185 includes a red filter, a green filter, and a blue filter, and the light blocking layer 180 may be positioned between the respective color filters in response to the respective filters 185. In some aspects, the common electrode 152 may be positioned on the color filter 185, and an upper alignment layer 172 may be positioned on the common electrode 152. In some aspects, the liquid crystal layer 160 may be injected between the upper alignment layer 172 and the lower alignment layer 171, and maintains a specific alignment state by the upper alignment layer 172 and the lower alignment layer 171.

Although it is not illustrated in FIG. 1, the plurality of gate lines and the plurality of data lines are formed so as to cross each other on the first substrate SUB1. In some aspects, the gate line transmits a gate signal, and is connected with the gate electrode 11 of the thin film transistor TFT. In some aspects, the data line transmits a data signal, and is connected with the source electrode 12 of the thin film transistor TFT. Then, the hydrogen blocking layer 120a may be formed on an entirety of a display region (not illustrated) in which a plurality of pixels is arranged to implement the same hydrogen blocking function for the active layers 140 of the plurality of thin film transistors TFT.

Figure 2:
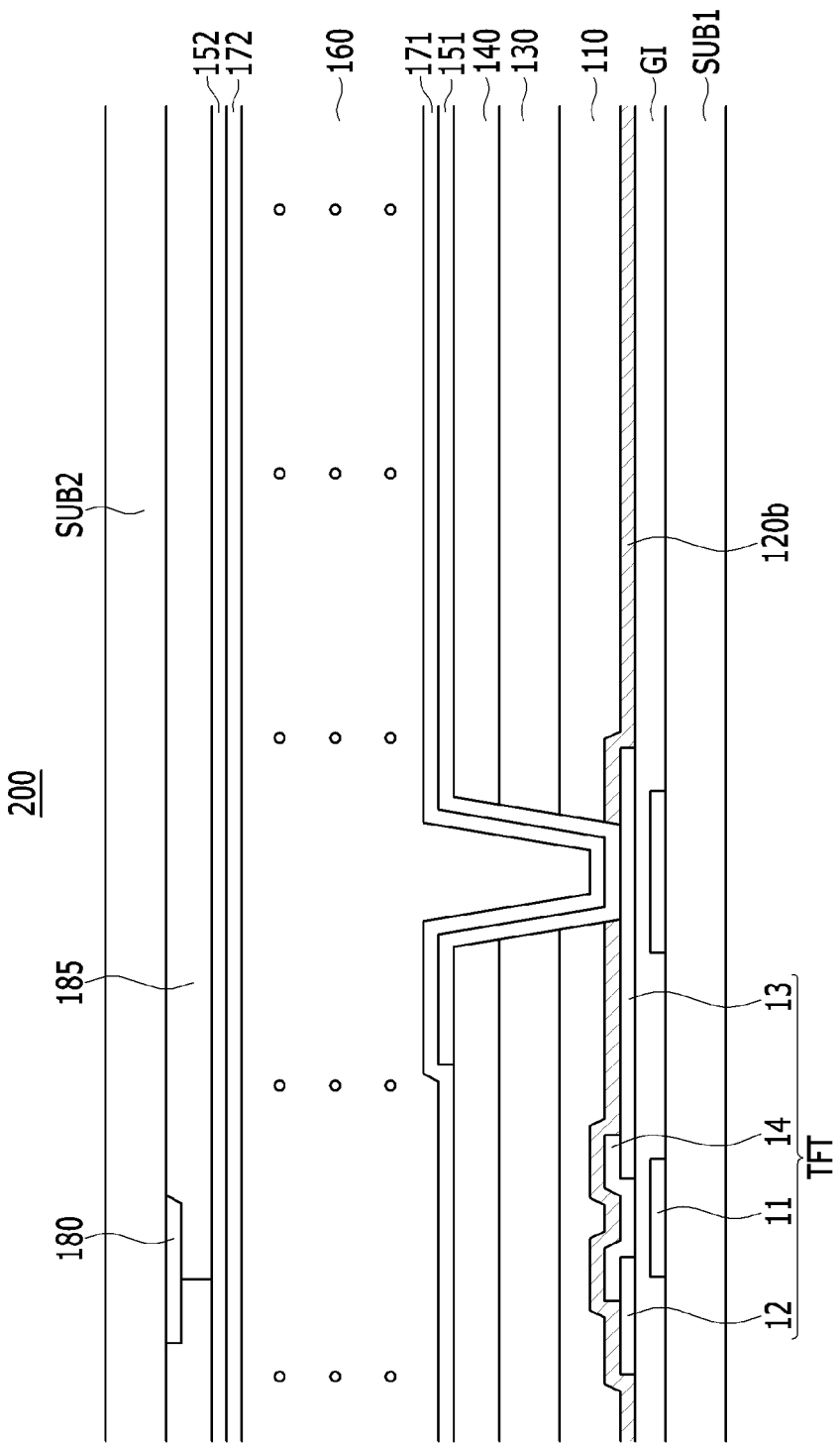
FIG. 2 is a cross-sectional view of a display device according to another embodiment.

FIG. 2 is a cross-sectional view of a display device according to a second exemplary embodiment.

Referring to FIG. 2, the display device 200 according to the second exemplary embodiment includes the same configuration as that of the display device of the first exemplary embodiment, except for the fact that a hydrogen blocking layer 120b is positioned between an active layer 14 and an etching stopping layer 110. The same element as that of the first exemplary embodiment is denoted by the same reference numeral, and a different configuration from that of the first exemplary embodiment will be mainly described below.

In some aspects, the hydrogen blocking layer 120b may be directly formed on the active layer 14 and source/drain electrodes 12 and 13, and may be in contact with the etching stopping layer 110. In some aspects, the etching stopping layer 110 serves to protect the active layer 14 together with the hydrogen blocking layer 120b and a passivation layer 130, but hydrogen may be diffused to the active layer 14 according to a process condition of the forming of the etching stopping layer 110.

In some aspects, the hydrogen blocking layer 120b in the second exemplary embodiment may be directly formed on the active layer 14 and the source/drain electrodes 12 and 13 to prevent the active layer 14 from being in direct contact with the etching stopping layer 110. In some aspects, the hydrogen blocking layer 120b effectively blocks the hydrogen diffused from the etching stopping layer 110, as well as the hydrogen diffused from the passivation layer 130, thereby suppressing characteristic deterioration of the active layer 14.

Figure 3:
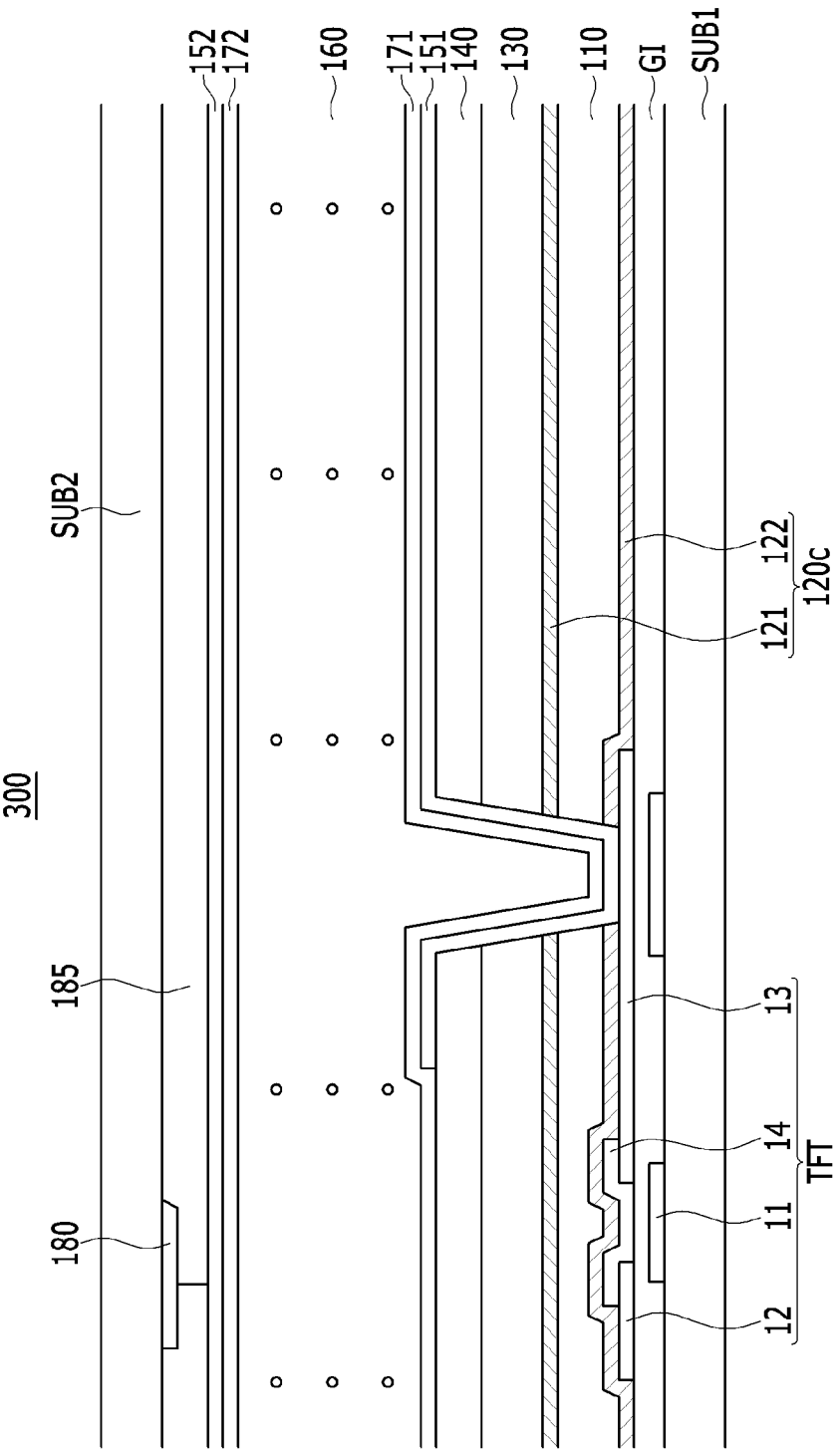
FIG. 3 is a cross-sectional view of a display device according to another embodiment.

FIG. 3 is a cross-sectional view of a display device according to a third exemplary embodiment.

Referring to FIG. 3, the display device 300 according to the third exemplary embodiment includes the same configuration as that of the display device of the first exemplary embodiment, except for the fact that a hydrogen blocking layer 120c may be additionally formed between an active layer 14 and an etching stopping layer 110. The same element as that of the first exemplary embodiment is denoted by the same reference numeral, and a different configuration from that of the first exemplary embodiment will be mainly described below.

In some aspects, the hydrogen blocking layer 120c includes a first hydrogen blocking layer 121 positioned between the etching stopping layer 110 and a passivation layer 130, and a second hydrogen blocking layer 122 positioned between the active layer 14, source/drain electrodes 12 and 13, and the etching stopping layer 110 as shown in FIG. 3. As described above, hydrogen may be diffused from the etching stopping layer 110 to the active layer 14 according to a process condition of the etching stopping layer 110, so that the second hydrogen blocking layer 122 blocks the hydrogen diffused from the etching stopping layer 110 to the active layer 14.

In some aspects, the first hydrogen blocking layer 121 and the second hydrogen blocking layer 122 includes at least one of aluminum-neodymium (AlNd) oxide, aluminum-nickel-lanthanum (AlNiLa) oxide, aluminum-nickel-germanium-lanthanum (AlNiGeLa) oxide, and aluminum-cobalt-germanium-lanthanum (AlCoGeLa) oxide.

In some aspects, the display device 300 of the third exemplary embodiment may block the hydrogen diffused from the etching stopping layer 110 and the hydrogen diffused from the passivation layer 130 twice according to a dual structure of the first hydrogen blocking layer 121 and the second hydrogen blocking layer 122, thereby more effectively suppressing characteristic deterioration of the active layer 14.

Figure 4:
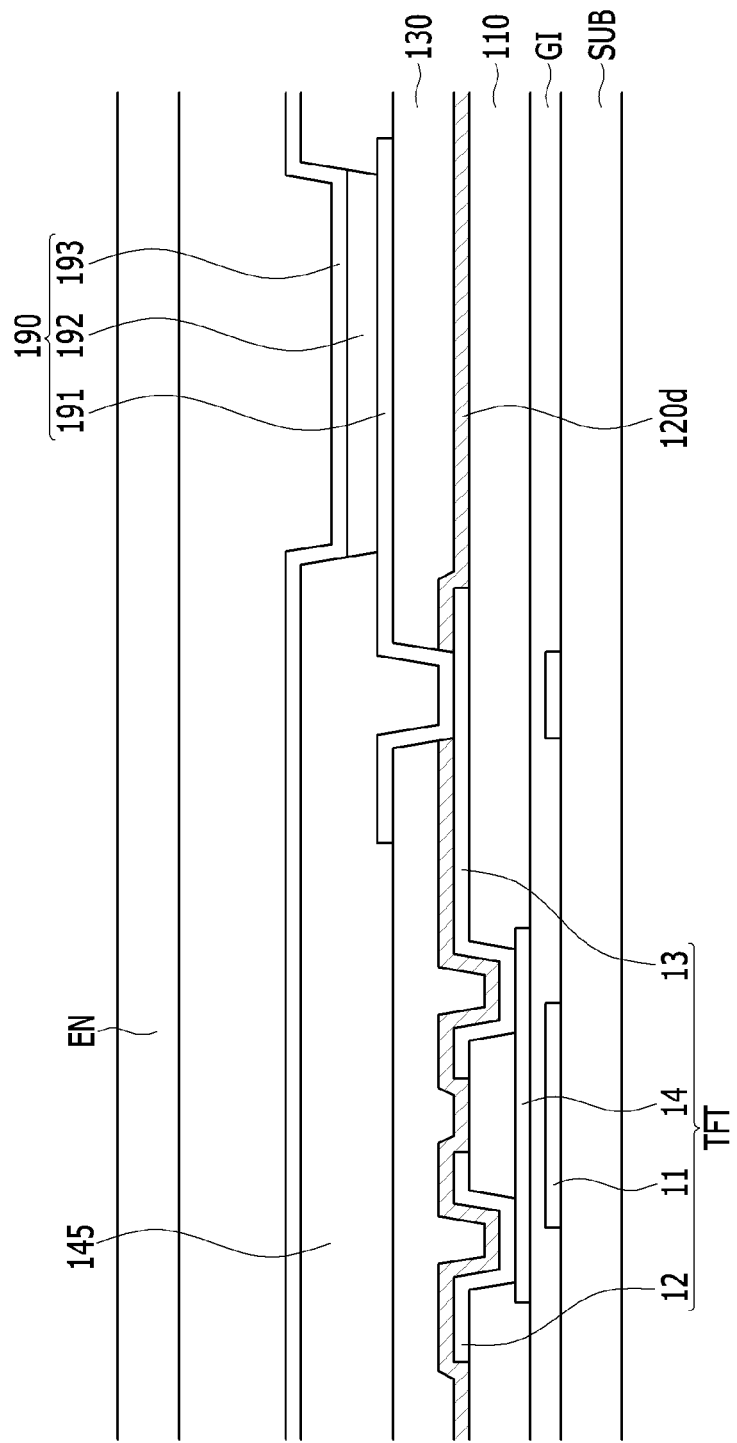
FIG. 4 is a cross-sectional view of a display device according to another embodiment.

FIG. 4 is a cross-sectional view of a display device according to a fourth exemplary embodiment.

Referring to FIG. 4, the display device 400 of the fourth exemplary embodiment includes a substrate SUB, a thin film transistor TFT, a hydrogen blocking layer 120d, and a passivation layer 130. The display device 400 of the fourth exemplary embodiment is an organic light emitting display device, and further includes an organic light emitting diode 190 and an encapsulation member EN. FIG. 4 illustrates one pixel area.

In some aspects, the substrate SUB is formed of an insulation substrate, such as glass or a polymer film. When the substrate SUB is formed of a polymer film, the substrate SUB may have a bending characteristic. In some aspects, the thin film transistor TFT includes a gate electrode 11, source/drain electrodes 12 and 13, and an active layer 14 connected to the source/drain electrodes 12 and 13. In some aspects, the gate electrode 11 may be formed on the substrate SUB, and a gate insulating layer GI may be formed on the entire substrate SUB so as to cover the gate electrode 11.

In some aspects, the active layer 14 may be positioned on the gate insulating layer GI, and an etching stopping layer 110 may be positioned on the active layer 14. In some aspects, the source/drain electrodes 12 and 13 may be positioned on the etching stopping layer 110 while having a distance therebetween. In some aspects, each of the source/drain electrodes 12 and 13 may be connected to the active layer 14 through a via hole formed in the etching stopping layer 110. In some aspects, the active layer 14 includes an oxide semiconductor, and a passivation layer 130 may be positioned on the source/drain electrodes 12 and 13.

In some aspects, the thin film transistor TFT of the fourth exemplary embodiment has a similar configuration to that of the aforementioned thin film transistor of the first exemplary embodiment except for that the etching stopping layer 110 may be positioned between the active layer 14 and the source/drain electrodes 12 and 13, and the source/drain electrodes 12 and 13 are positioned on the active layer 14. In some aspects, the etching stopping layer 110 may include silicon oxide, and the passivation layer 130 may include silicon nitride or silicon oxide.

In the display device of the fourth exemplary embodiment, the hydrogen blocking layer 120d may be positioned between the active layer 14 and the passivation layer 130. In some aspects, the hydrogen blocking layer 120d may be positioned between the source/drain electrodes 12 and 13 and the passivation layer 130.

In some aspects, the hydrogen blocking layer 120d includes at least one of aluminum-neodymium (AlNd) oxide, aluminum-nickel-lanthanum (AlNiLa) oxide, aluminum-nickel-germanium-lanthanum (AlNiGeLa) oxide, and aluminum-cobalt-germanium-lanthanum (AlCoGeLa) oxide, and blocks the hydrogen diffused to the active layer in a process of depositing the passivation layer 130 to suppress characteristic deterioration of the active layer 14. A physical characteristic of the hydrogen blocking layer 120d and a resulting action are the same as those of the first exemplary embodiment, so that a detailed description will be omitted.

In some aspects, a pixel electrode 191 may be positioned on the passivation layer 130, and a pixel defining layer 145 may be positioned on the pixel electrode 191 and the passivation layer 130. One pixel electrode 191 is included in each pixel, and is connected to the drain electrode 13 of the thin film transistor TFT through a via hole formed at the passivation layer 130. In some aspects, the pixel defining layer 145 forms an opening so as to expose a part of the pixel electrode 191.

In some aspects, an organic emission layer 192 may be formed on the pixel electrode 191, and a common electrode 193 may be formed on the plurality of pixel electrodes 191. In some aspects, the pixel electrode 191, the organic emission layer 192, and the common electrode 193 form an organic light emitting diode 190. In some aspects, the pixel electrode 191 may be an anode for injecting holes in the organic emission layer 192, and the common electrode 193 may be a cathode for injecting electrons in the organic emission layer 192.

When the electrons and the holes are injected to the organic emission layer 192 from the pixel electrode 191 and the common electrode 193, light is emitted when excitons drop from an excited state to a ground state. Any one of the pixel electrode 191 and the common electrode 193 may be a reflective electrode, and the other one may be a transmissive electrode. In some aspects, the light discharged from the organic emission layer 192 penetrates the transmissive electrode to be discharged to the outside.

In some aspects, the organic emission layer 192 may include a red organic emission layer, a green organic emission layer, and a blue organic emission layer, and the red organic emission layer, the green organic emission layer, and the blue organic emission layer are formed at a red pixel, a green pixel, and a blue pixel, respectively, thereby implementing a color image.

In some aspects, the organic emission layer 192 may implement a color image by stacking a red organic emission layer, a green organic emission layer, and a blue organic emission layer on all of a red pixel, a green pixel, and a blue pixel, and arranging a red color filter, a green color filter, and a blue color filter for each pixel.

In some aspects, the organic emission layer 192 may implement a color image by forming a white organic emission layer for emitting white light at all of a red pixel, a green pixel, and a blue pixel, and arranging a red color filter, a green color filter, and a blue color filter for each pixel. In this case, it is not necessary to use a deposition mask for forming each of the red organic emission layer, the green organic emission layer, and the blue organic emission layer, thereby being advantageous to improve resolution.

In some aspects, the white organic emission layer may be formed as one organic emission layer, or include a configuration in which the plurality of organic emission layers is stacked to emit white light. For example, the white organic emission layer may include a configuration in which at least one yellow organic emission layer is mixed with at least one blue organic emission layer, or a configuration in which at least one cyan organic emission layer is mixed with at least one red organic emission layer. Further, the white organic emission layer may include a configuration in which at least one magenta organic emission layer is mixed with at least one green organic emission layer. In some aspects, the encapsulation member EN may be formed of glass, a polymer film, or metal, or may include a thin film encapsulation layer in which a plurality of organic layers and a plurality of inorganic layers are alternately and repeatedly stacked one or more times. In some embodiments, the encapsulation member EN seals the plurality of organic light emitting diodes to block moisture and oxygen contained in the air from permeating. When the substrate SUB and the encapsulation member EN are formed of a bendable material, the entire display device 400 may have a bending characteristic.

In some aspects, the display device 400 of the fourth exemplary embodiment may further include gate wirings for transmitting a scan signal, and data wirings including data lines and driving power lines (not illustrated). Further, in the display device 400 of the fourth exemplary embodiment, the pixel may be positioned at a crossing region of the gate wiring and the data wiring, and includes at least two thin film transistors (a switching transistor and a driving transistor), a capacitor, and the aforementioned organic light emitting diode 190.

In some embodiments, the thin film transistor TFT illustrated in FIG. 1 may be the driving transistor, and a forming material, a position, and a function of the hydrogen blocking layer 120d for the switching transistor are the same as those of the driving transistor.

Figure 5:
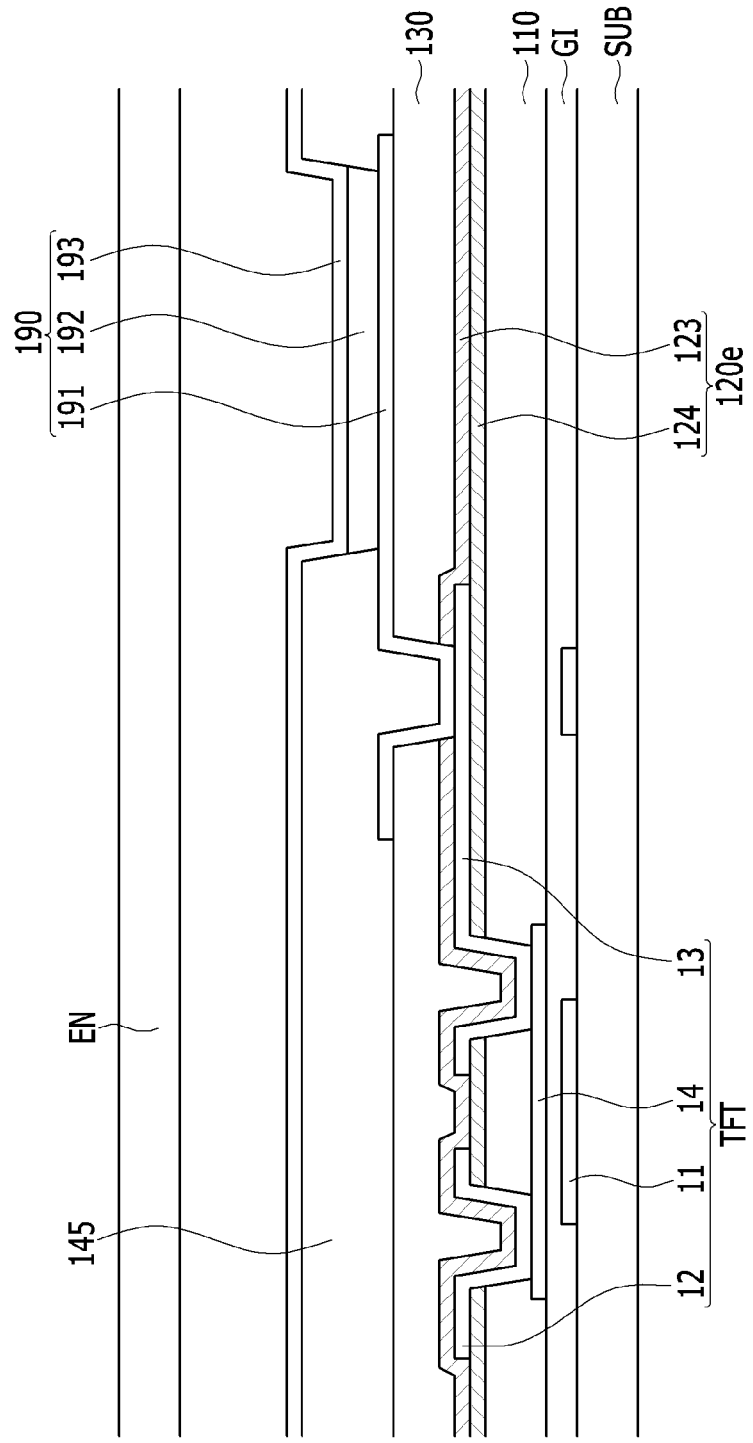
FIG. 5 is a cross-sectional view of a display device according to another embodiment.

FIG. 5 is a cross-sectional view of a display device according to a fifth exemplary embodiment.

Referring to FIG. 5, the display device 500 according to the fifth exemplary embodiment includes the same configuration as that of the display device of the fourth exemplary embodiment, except for the fact that a hydrogen blocking layer 120e is additionally formed directly on an etching stopping layer 110. The same element as that of the fourth exemplary embodiment is denoted by the same reference numeral, and a different configuration from that of the fourth exemplary embodiment will be mainly described below.

In some aspects, the hydrogen blocking layer 120e includes a first hydrogen blocking layer 123 positioned between source/drain electrodes 12 and 13 and the passivation layer, and a second hydrogen blocking layer 124 positioned between the etching stopping layer and the source/drain electrodes 12 and 13. In some aspects, the second hydrogen blocking layer 124 may be formed on the etching stopping layer 110 before the source/drain electrodes 12 and 13 are formed, and may be provided with a via hole together with the etching stopping layer 110 so as to allow the source/drain electrodes 12 and 13 to be in contact with the active layer 14.

In some aspects, the first hydrogen blocking layer 123 and the second hydrogen blocking layer 124 includes at least one of aluminum-neodymium (AlNd) oxide, aluminum-nickel-lanthanum (AlNiLa) oxide, aluminum-nickel-germanium-lanthanum (AlNiGeLa) oxide, and aluminum-cobalt-germanium-lanthanum (AlCoGeLa) oxide.

In the fifth exemplary embodiment, the two hydrogen blocking layers 123 and 124 may be positioned between the active layer 14 and the passivation layer 130 while overlapping each other, so that it is possible to block hydrogen diffused to the active layer 14 twice during a process of depositing the passivation layer 130, thereby more effectively suppressing characteristic deterioration of the active layer 14.

Figure 6:
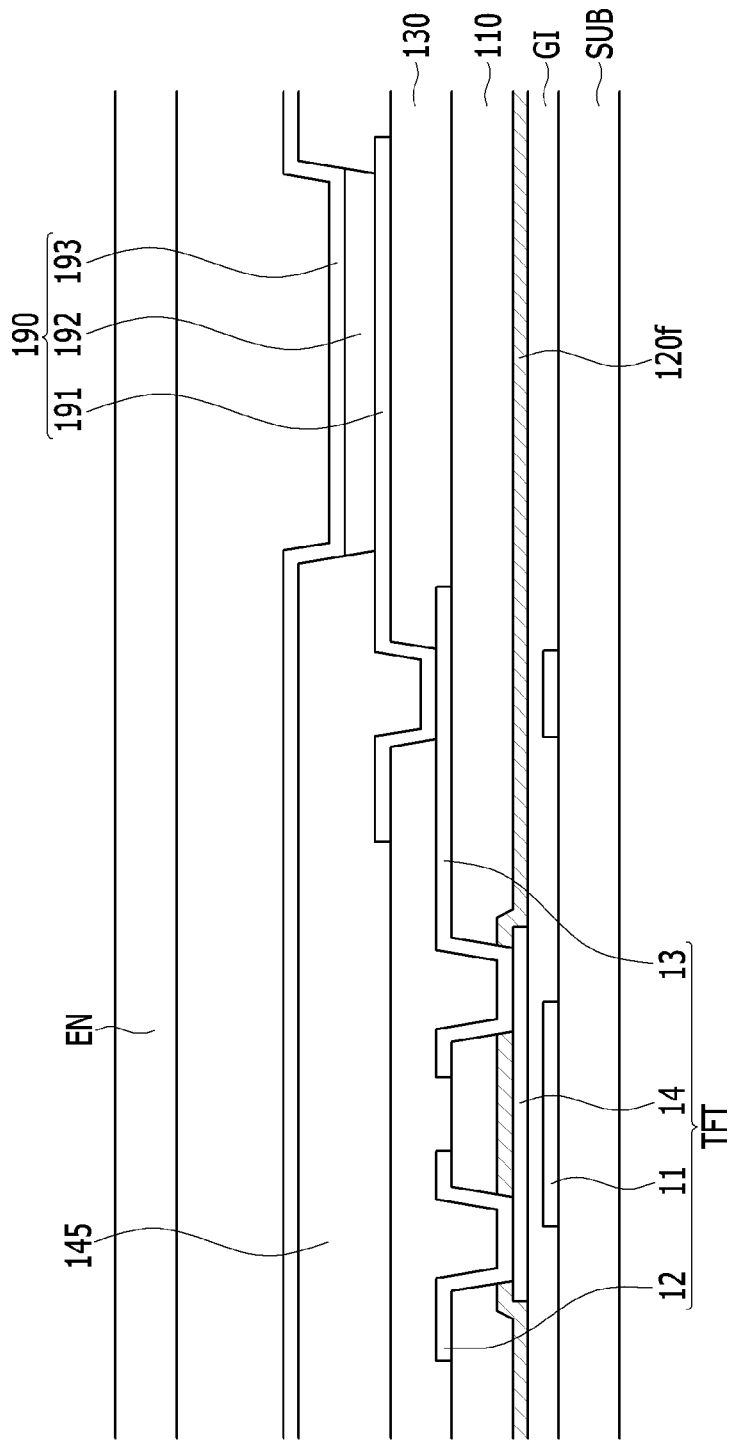
FIG. 6 is a cross-sectional view of a display device according to another embodiment.

FIG. 6 is a cross-sectional view of a display device according to a sixth exemplary embodiment.

Referring to FIG. 6, the display device 600 according to the sixth exemplary embodiment includes the same configuration as that of the display device of the fourth exemplary embodiment, except for the fact that a hydrogen blocking layer 120f may be positioned between an active layer 14 and an etching stopping layer 110. The same element as that of the fourth exemplary embodiment is denoted by the same reference numeral, and a different configuration from that of the fourth exemplary embodiment will be mainly described below.

In some aspects, the hydrogen blocking layer 120f is directly on the active layer 14, and may be formed on a gate insulating layer GI under the etching stopping layer 110. When a via hole is formed in the etching stopping layer 110, the via hole may be formed at the hydrogen blocking layer 120f so as to make the source/drain electrodes 12 and 13 be in contact with the active layer 14.

When the etching stopping layer 110 is formed, hydrogen may be diffused to the active layer 14 according to a processing condition. In some aspects, the hydrogen blocking layer 120f may be positioned under the etching stopping layer 110, so that it is possible to effectively block hydrogen diffused from the etching stopping layer 110 to the active layer 14, as well as hydrogen diffused from the passivation layer 130 to the active layer 14.

Figure 7:
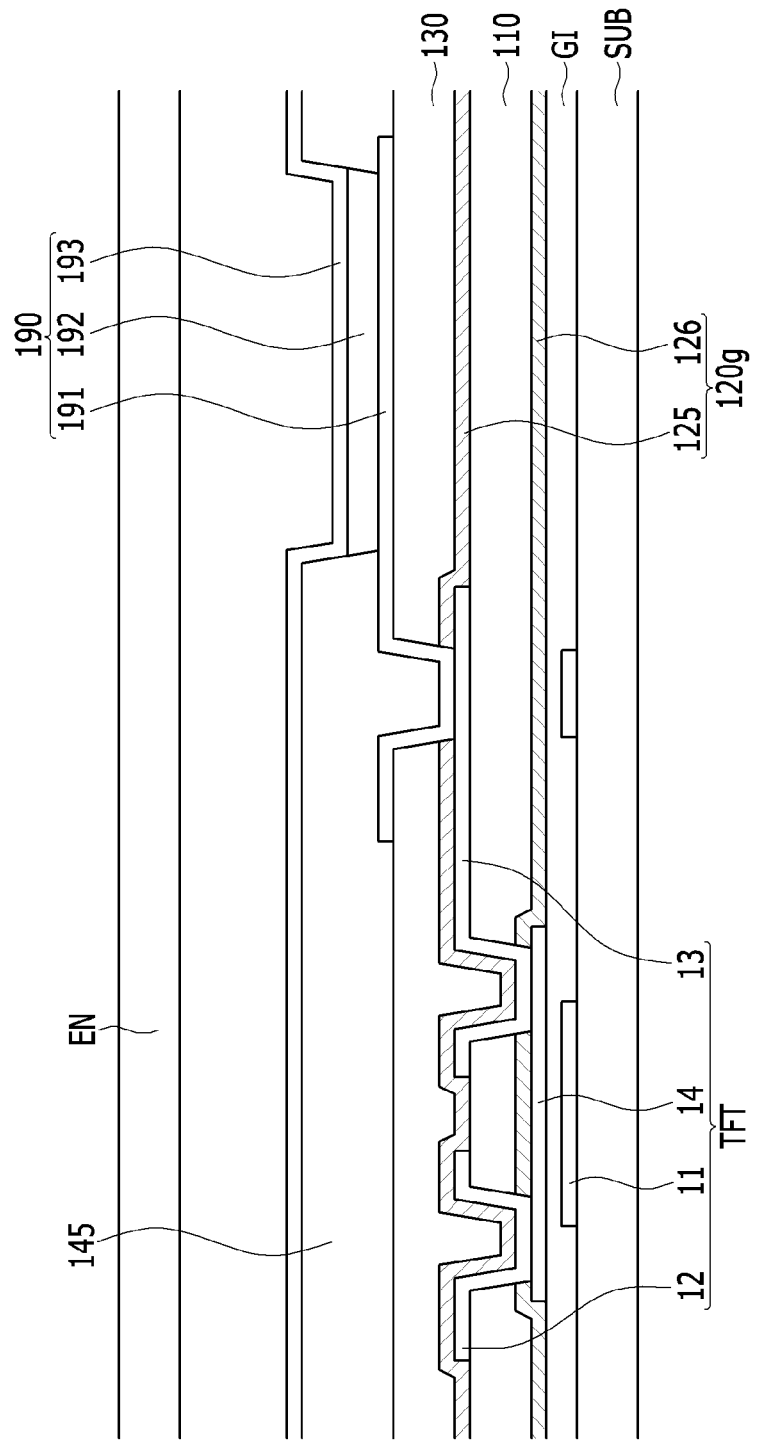
FIG. 7 is a cross-sectional view of a display device according to another embodiment.

FIG. 7 is a cross-sectional view of a display device according to a seventh exemplary embodiment.

Referring to FIG. 7, the display device 700 according to the seventh exemplary embodiment of includes the same configuration as that of the display device of the fourth exemplary embodiment, except for the fact that a hydrogen blocking layer 120g may be additionally formed between an active layer 14 and an etching stopping layer 110. The same element as that of the fourth exemplary embodiment is denoted by the same reference numeral, and a different configuration from that of the fourth exemplary embodiment will be mainly described below.

In some aspects, the hydrogen blocking layer 120g includes a first hydrogen blocking layer 125 positioned between source/drain electrodes 12 and 13 and a passivation layer 130, and a second hydrogen blocking layer 126 positioned between the active layer 14 and the etching stopping layer 110.

In some aspects, the second hydrogen blocking layer 126 may be directly on the active layer 14, and may be formed on a gate insulating layer GI under the etching layer 110. When a via hole is formed in the etching stopping layer 110, the via hole is also formed in the second hydrogen blocking layer 126 so as to make the source/drain electrodes 12 and 13 be in contact with the active layer 14.

In some aspects, the first hydrogen blocking layer 125 and the second hydrogen blocking layer 126 include at least one of aluminum-neodymium (AlNd) oxide, aluminum-nickel-lanthanum (AlNiLa) oxide, aluminum-nickel-germanium-lanthanum (AlNiGeLa) oxide, and aluminum-cobalt-germanium-lanthanum (AlCoGeLa) oxide.

In some aspects, the first hydrogen blocking layer 125 blocks hydrogen diffused from the passivation layer 130, and the second hydrogen blocking layer 126 blocks hydrogen diffused from the passivation layer 130 and the etching stopping layer 110. In the sixth exemplary embodiment, the two hydrogen blocking layers 121 and 122 may be positioned between the active layer 14 and the passivation layer 130 while overlapping each other, so that it is possible to effectively suppress diffusion of hydrogen toward the active layer 14.

Figure 8:
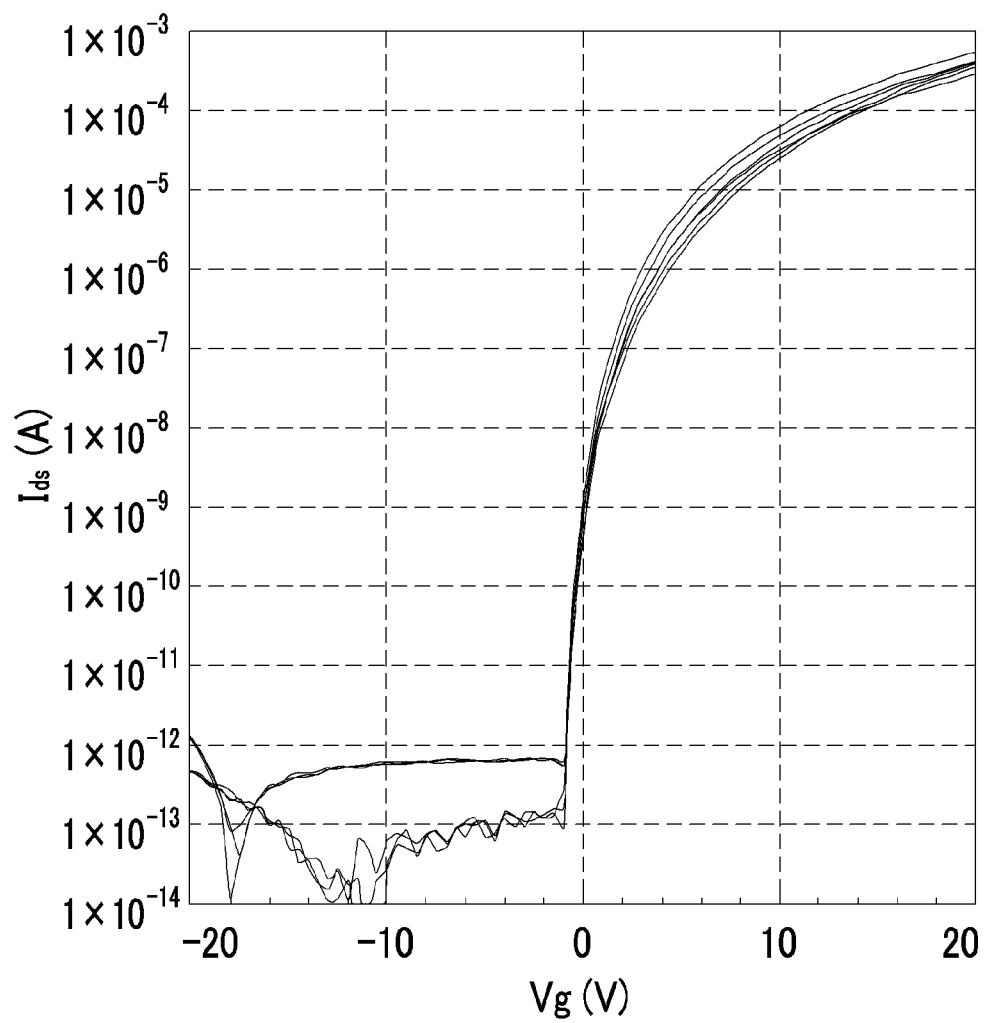
FIG. 8 is a graph illustrating measurement of a drain current Ids versus a gate voltage Vg of a thin film transistor in the display device according to the embodiment shown in FIG. 1.
Figure 9:
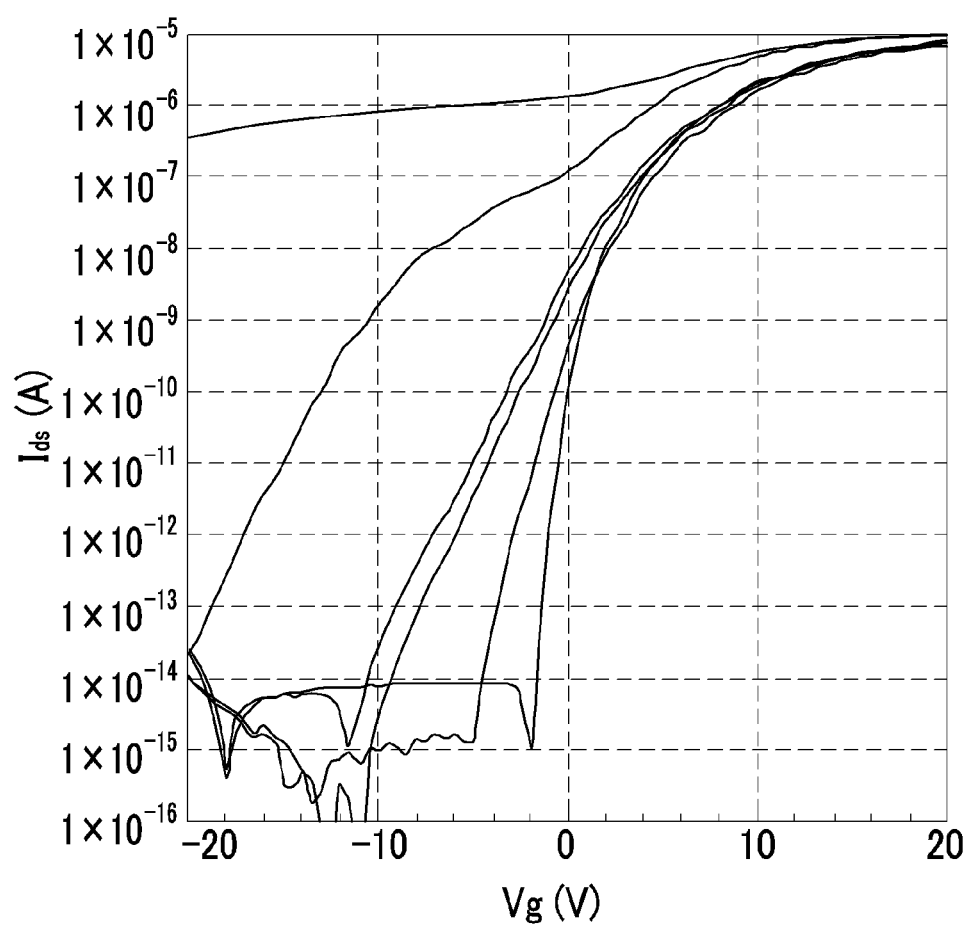
FIG. 9 is a graph illustrating measurement of a drain current Ids versus a gate voltage Vg of a thin film transistor in a display device according to a first comparative example which does not include a hydrogen blocking layer.

FIG. 8 is a graph illustrating measurement of a drain current Ids versus a gate voltage Vg of the thin film transistor in the display device according to the first exemplary embodiment, and FIG. 9 is a graph illustrating measurement of a drain current Ids versus a gate voltage Vg of the thin film transistor in a display device according to a first comparative example which does not include the hydrogen blocking layer. Six points within the display device are selected so as to measure and represent a characteristic of a drain current Ids versus a gate voltage Vg of the thin film transistor.

The display device according the first comparative example has the same structure and is made of the same material as those of the display device of the first exemplary embodiment, except for the fact that the hydrogen blocking layer is omitted. In the display device of the first exemplary embodiment used in an experiment, the active layer includes indium-gallium-zinc oxide (In—Ga—Zn—O), and the hydrogen blocking layer includes aluminum-neodymium (AlNd) oxide. The etching stopping layer is formed of a silicon oxide layer, and the passivation layer is formed of a silicon nitride layer.

When an initial threshold voltage of the display device of the first exemplary embodiment is 3 to 4 V, and a gate voltage is 0 V, leakage current $I_{off\ current}$ is at a level of $10^{-9}$ A. When an initial threshold voltage of the display device of the first comparative example is 7 to 8 V, and a gate voltage is 0 V, leakage current is at a level of $10^{-6}$ to $10^{-10}$ A. As the leakage current of the thin film transistor is small, an on/off characteristic is improved and a display quality of the display device is improved.

The display device of the first exemplary embodiment has small deviation in the characteristic of the thin film transistor depending on a measurement point, and exhibits an accurate on/off characteristic. In some aspects, the display device of the first comparative example has large characteristic deviation of the thin film transistor depending on a measurement point, and exhibits a result of loss of the semiconductor characteristic and defect generation in a partial thin film transistor.

Figure 10:
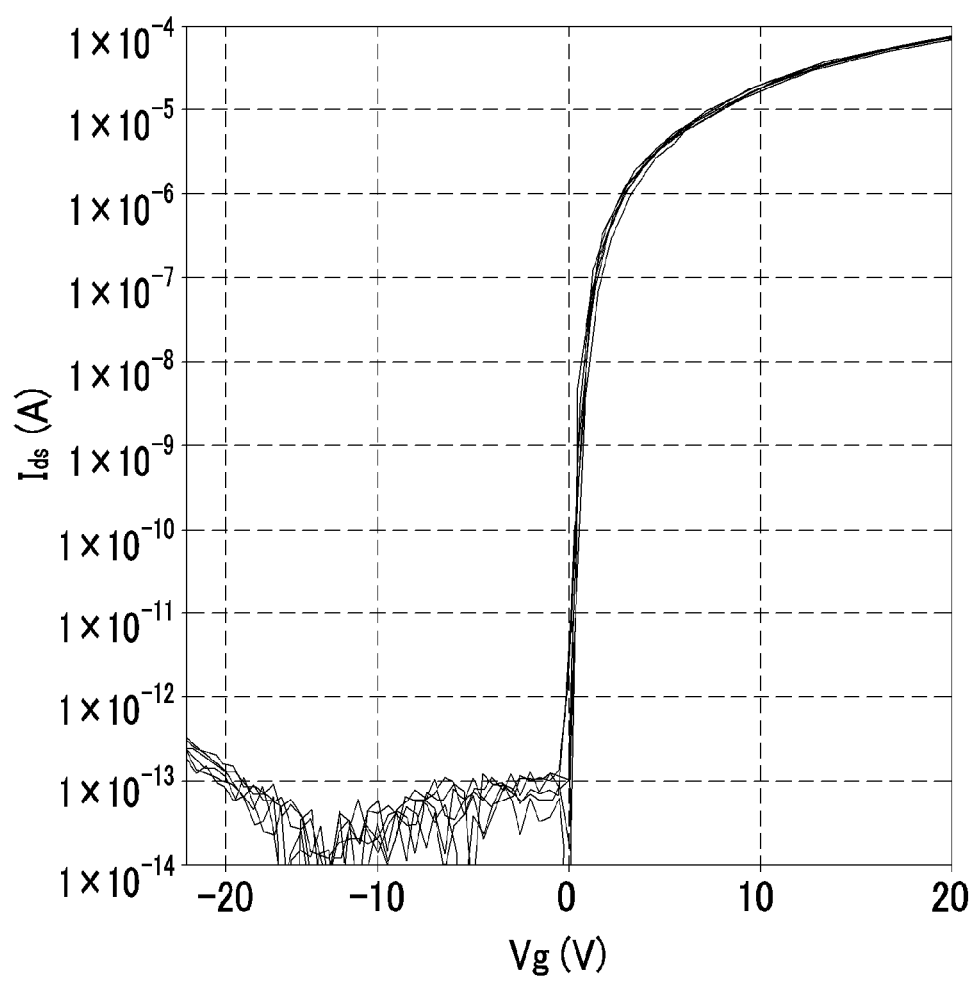
FIG. 10 is a graph illustrating measurement of a drain current Ids versus a gate voltage Vg of a thin film transistor in the display device according to the embodiment shown in FIG. 4.
Figure 11:
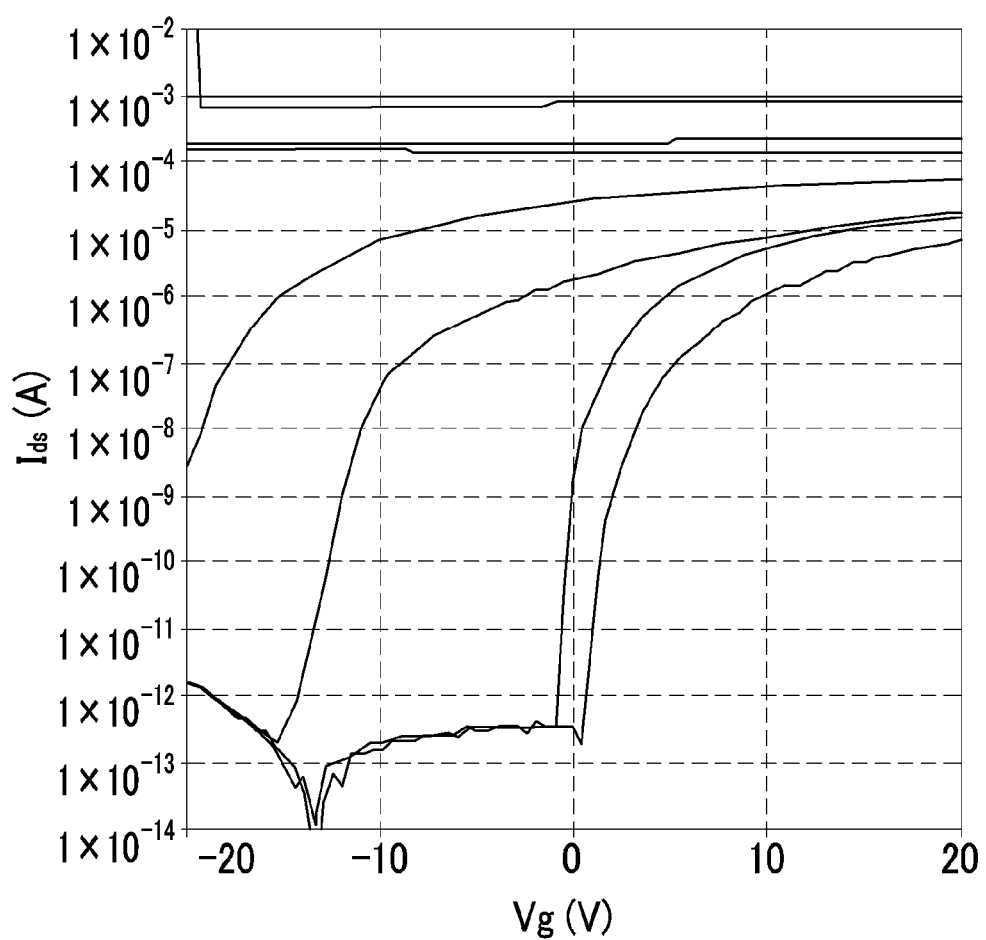
FIG. 11 is a graph illustrating measurement of a drain current Ids versus a gate voltage Vg of a thin film transistor in a display device according to a second comparative example which does not include a hydrogen blocking layer.

FIG. 10 is a graph illustrating measurement of a drain current Ids versus a gate voltage Vg of the thin film transistor in the display device according to the fourth exemplary embodiment, and FIG. 11 is a graph illustrating measurement of a drain current Ids versus a gate voltage Vg of the thin film transistor in the display device according to a second comparative example which does not include the hydrogen blocking layer. Six points within the display device are selected so as to measure and represent a drain current Ids versus a gate voltage Vg of the thin film transistor.

The display device according the second comparative example has the same configuration as that of the display device of the fourth exemplary embodiment, except for the fact that the hydrogen blocking layer is omitted. In some aspects, the active layer includes indium-gallium-oxide (In—Ga—Zn—O), and the hydrogen blocking layer includes aluminum-neodymium (AlNd) oxide. In some aspects, the etching stopping layer and the passivation layer are formed of a silicon nitride layer.

When an initial threshold voltage of the display device of the fourth exemplary embodiment is 3 to 4 V, and a gate voltage is 0 V, leakage current $I_{off\ current}$ is in a level of $10^{-10}$ A. When an initial threshold voltage of the display device of the second comparative example is −10 to 2 V, and a gate voltage is 0 V, leakage current is in a level of $10^{-3}$ to $10^{-13}$ A.

The display device of the fourth exemplary embodiment has small deviation in the characteristic of the thin film transistor depending on a measurement point, and exhibits an accurate on/off characteristic. In some aspects, the display device of the second comparative example has large characteristic deviation of the thin film transistor depending on a measurement point, and exhibits a result that at least four thin film transistors lose the semiconductor characteristic and generate defects.

The measurement result illustrated in FIG. 8 from a device of the first exemplary embodiment, and the measurement result illustrated in FIG. 10 from a device of the fourth exemplary embodiment come from the fact that the display devices of the first exemplary embodiment and the fourth exemplary embodiment include the hydrogen blocking layer in the entire display area to exhibit a uniform hydrogen blocking function for the active layers of the plurality of thin film transistors.

Figure 12A:
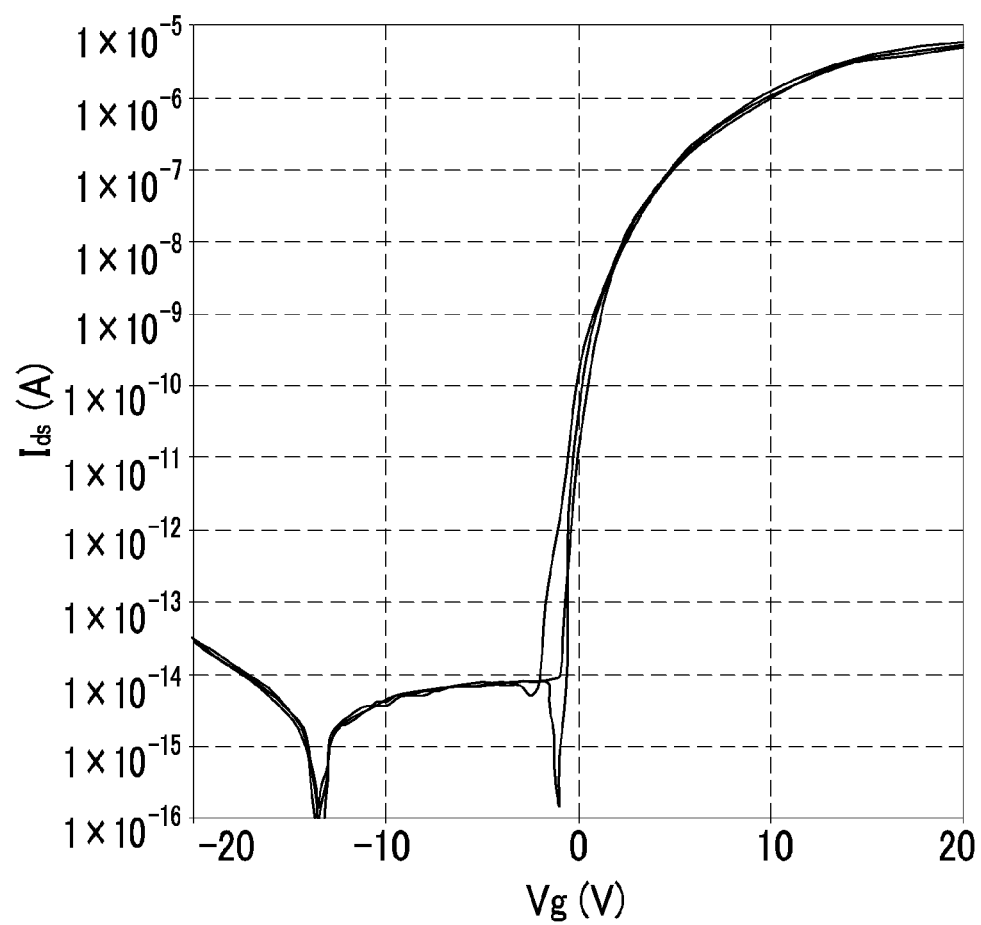
FIGS. 12A and 12B are graphs illustrating measurement of a drain current Ids versus a gate voltage Vg at the same point in three display devices according to the embodiment shown in FIG. 1 manufactured by using the same deposition equipment.
Figure 12B:
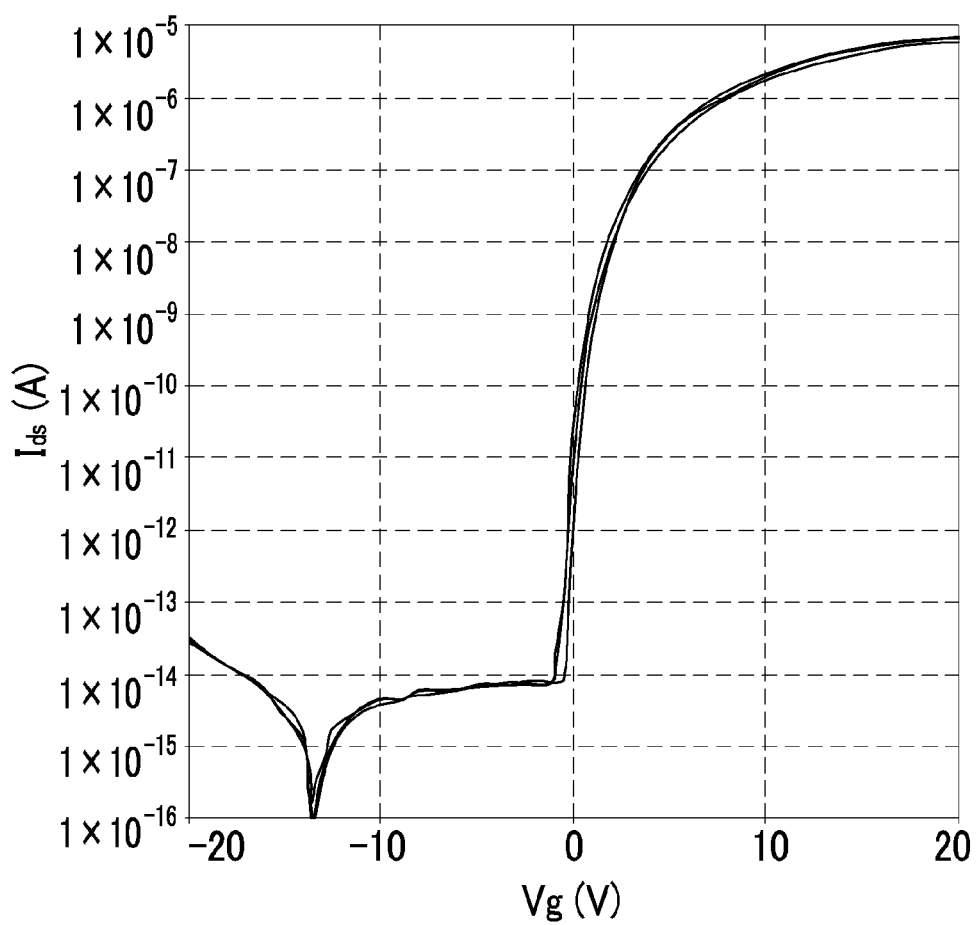

FIGS. 12A and 12B are graphs illustrating measurement of a drain current Ids versus a gate voltage Vg at the same point in three display devices according to the first exemplary embodiment manufactured by using the same deposition equipment. FIG. 12A represents a characteristic result of the thin film transistor at one point positioned at the center of the display region, and FIG. 12B represents a characteristic result of the thin film transistor at one point positioned at an edge of the display region.

Figure 13A:
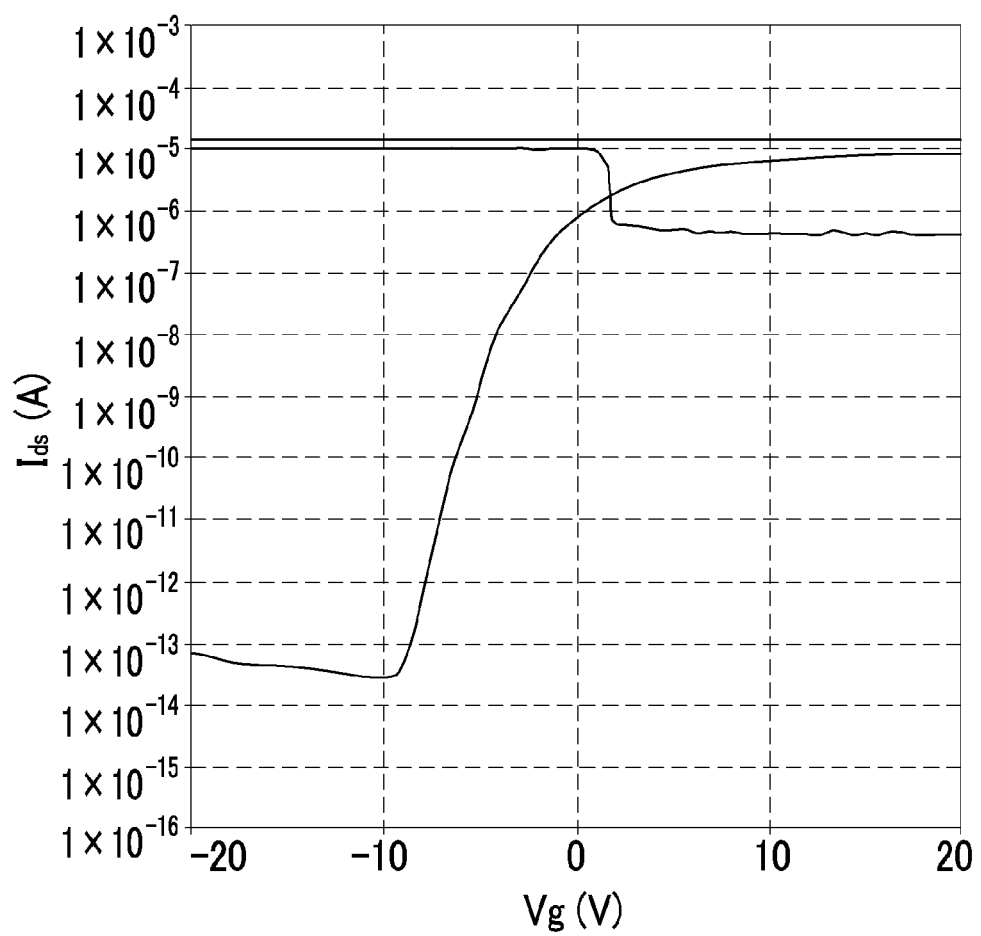
FIGS. 13A and 13B are graphs illustrating measurement of a drain current Ids versus a gate voltage Vg at the same point in three display devices according to the first comparative example manufactured by using the same deposition equipment as that of the embodiment shown in FIG. 1.
Figure 13B:
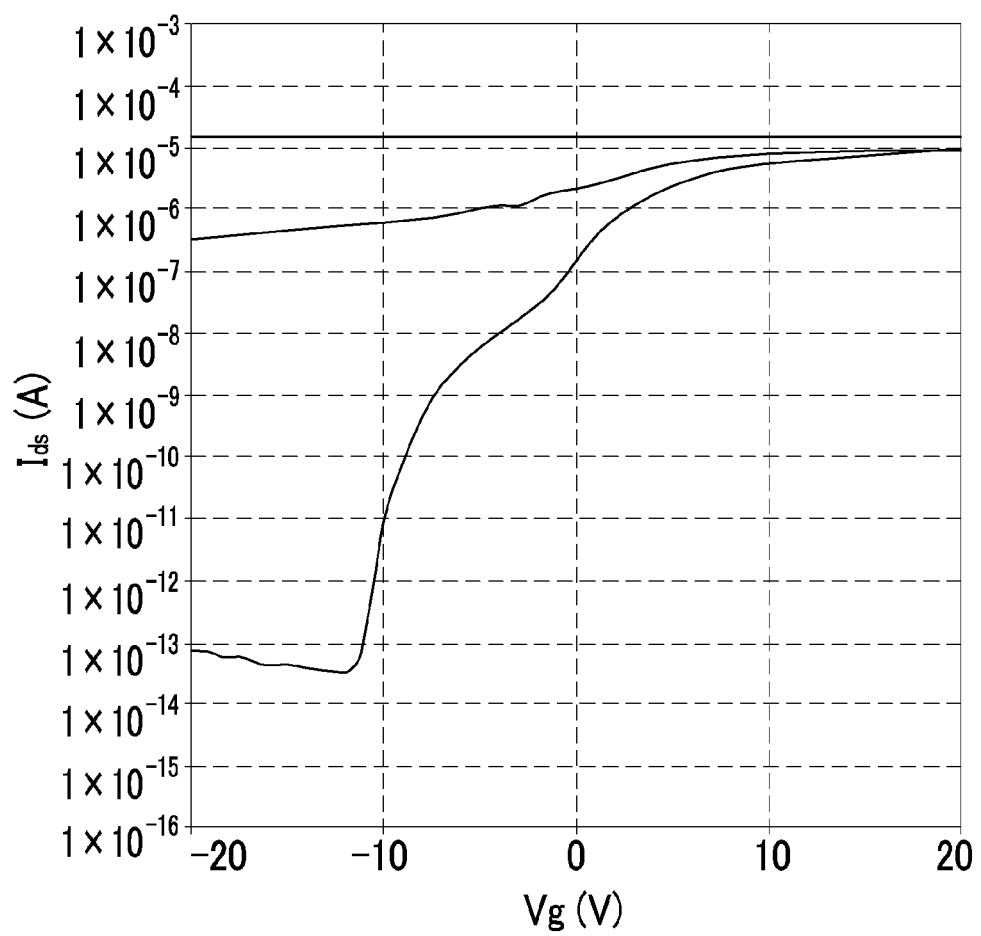

FIGS. 13A and 13B are graphs illustrating measurement of a drain current Ids versus a gate voltage Vg at the same point in three display devices according to the first comparative example manufactured by using the same deposition equipment as that of the first exemplary embodiment. FIG. 13A represents a characteristic result of the thin film transistor at one point positioned at the center of the display region, and FIG. 13B represents a characteristic result of the thin film transistor at one point positioned at an edge of the display region.

Referring to FIGS. 12A and 12B, the display device of the first exemplary embodiment has little characteristic deviation of the thin film transistor according to a manufacturing process and exhibits an accurate on/off characteristic. The result comes from the uniform blocking of the influence of hydrogen exerted on the plurality of active layers by the hydrogen blocking layer in the plurality of display devices manufactured by using the same deposition equipment.

In contrast, referring to FIGS. 13A and 13B, the display devices of the first comparative example has very low reproduction for the plurality of display devices manufactured by using the same deposition equipment, and some thin film transistors exhibit a result of loss of a semiconductor characteristic and defect generation. The result comes from the fact that the hydrogen flows in the active layer during the process of depositing the passivation layer, and influence of the hydrogen exerted on the plurality of active layers is changed even under a delicate change of the condition.

Figure 14A:
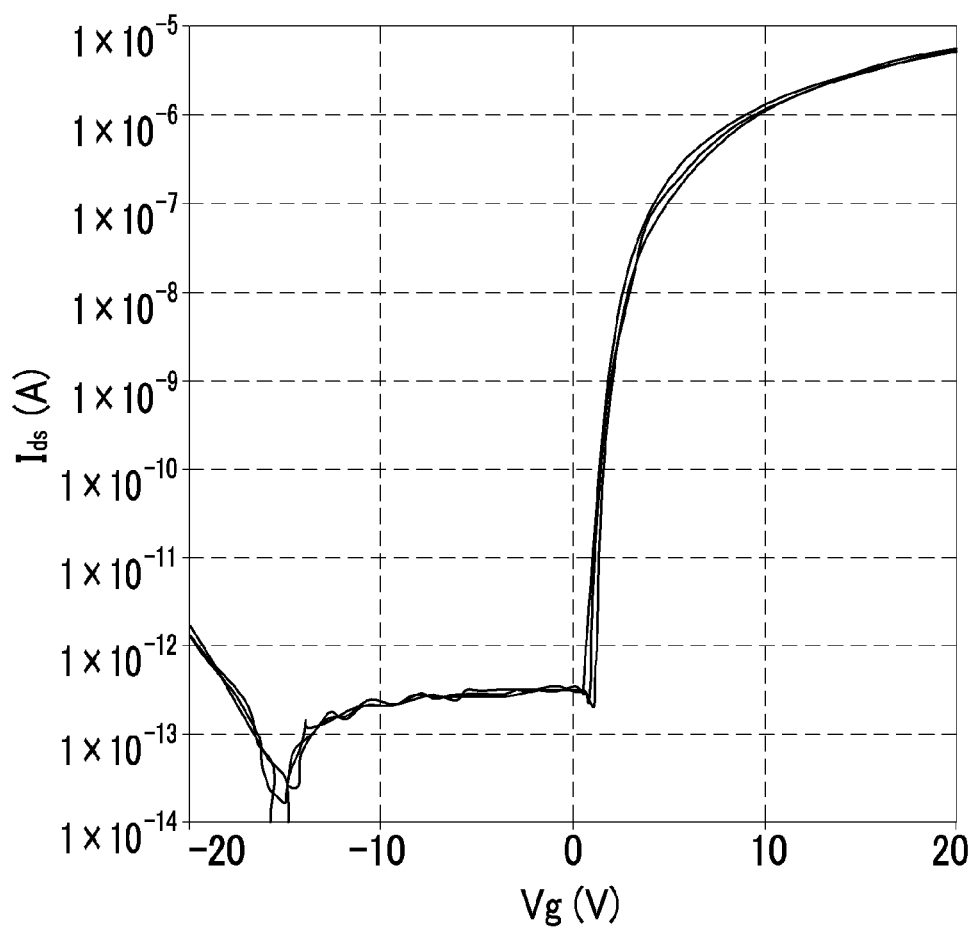
FIGS. 14A and 14B are graphs illustrating measurement of a drain current Ids versus a gate voltage Vg at the same point in three display devices according to the embodiment shown in FIG. 4 manufactured by using the same deposition equipment.
Figure 14B:
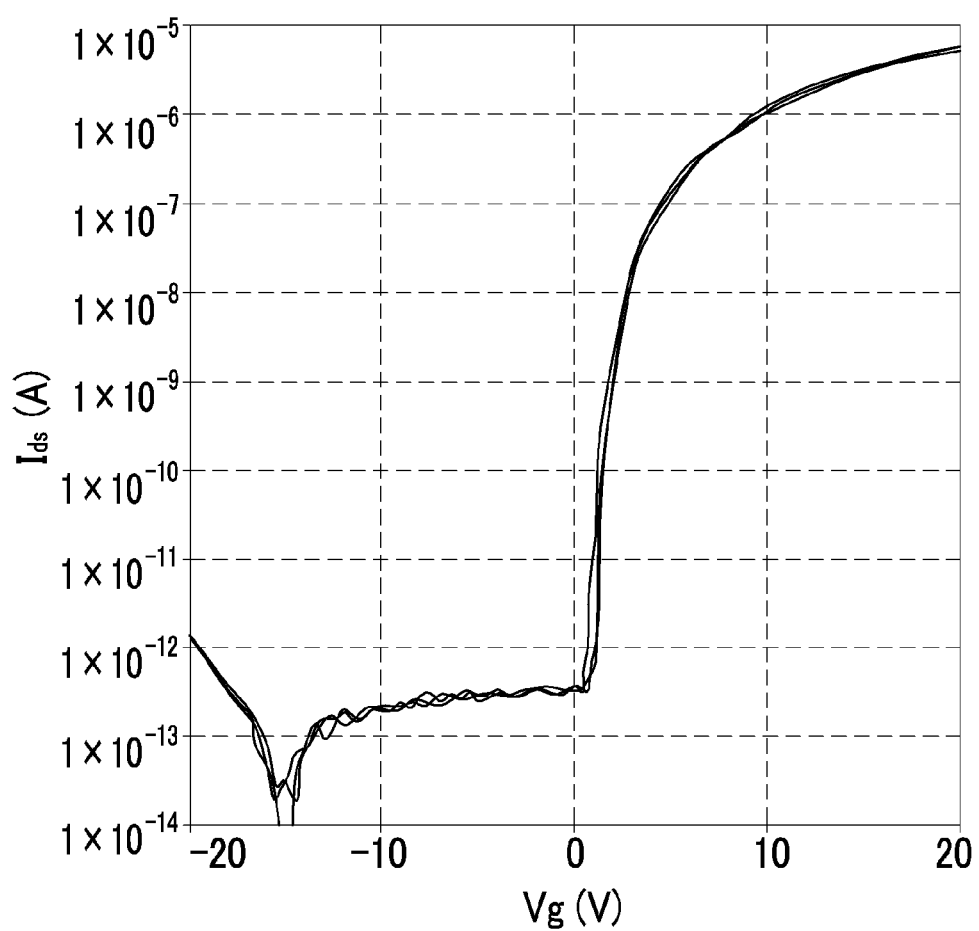

FIGS. 14A and 14B are graphs illustrating measurement of a drain current Ids versus a gate voltage Vg at the same point in three display devices according to the fourth exemplary embodiment manufactured by using the same deposition equipment. FIG. 14A represents a characteristic result of the thin film transistor at one point positioned at the center of the display region, and FIG. 14B represents a characteristic result of the thin film transistor at one point positioned at an edge of the display region.

Figure 15A:
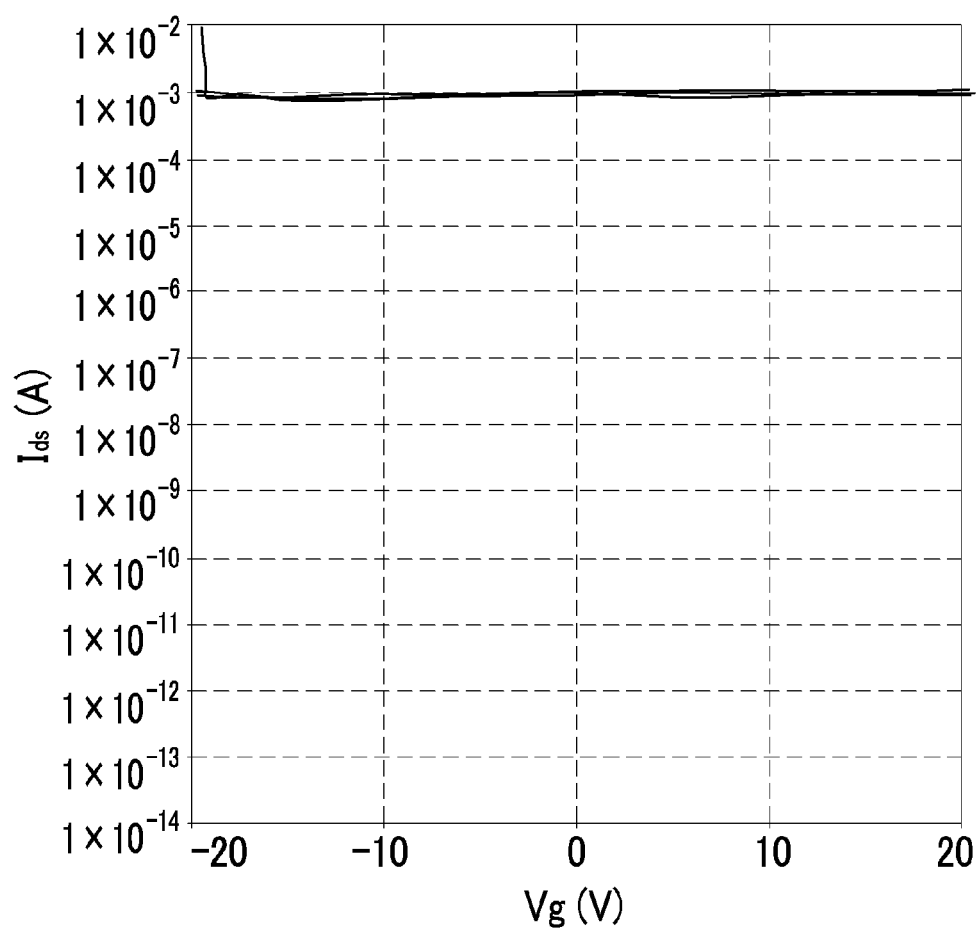
FIGS. 15A and 15B are graphs illustrating measurement of a drain current Ids versus a gate voltage Vg at the same point in three display devices according to the second comparative example by using the same deposition equipment as that of the embodiment shown in FIG. 4.
Figure 15B:
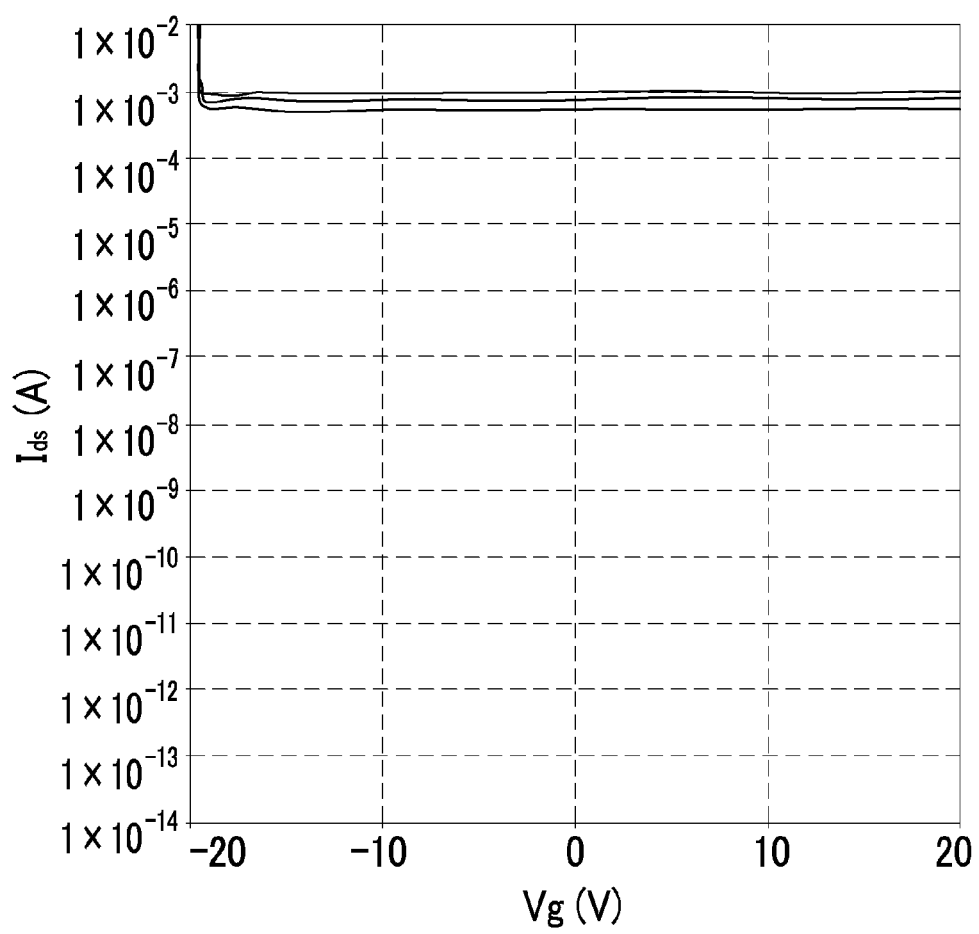

FIGS. 15A and 15B are graphs illustrating measurement of a drain current Ids versus a gate voltage Vg at the same point in three display devices according to the second comparative example by using the same deposition equipment as that of the fourth exemplary embodiment. FIG. 15A represents a characteristic result of the thin film transistor at one point positioned at the center of the display region, and FIG. 15B represents a characteristic result of the thin film transistor at one point positioned at an edge of the display region.

Referring to FIGS. 14A and 14B, the display device of the fourth exemplary embodiment has little characteristic deviation of the thin film transistor according to a manufacturing process and exhibits an accurate on/off characteristic. In the meantime, referring to FIGS. 15A and 15B, the display device of the second comparative example shows the result that all of the measured thin film transistors lose the semiconductor characteristic and generate defects.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a substrate;
a thin film transistor formed on the substrate, and comprising an active layer formed of an oxide semiconductor;
a passivation layer formed on the thin film transistor; and
a hydrogen blocking layer positioned between the active layer and the passivation layer, and including at least one selected from the group consisting of aluminum-neodymium (AlNd) oxide, aluminum-nickel-lanthanum (AlNiLa) oxide, aluminum-nickel-germanium-lanthanum (AlNiGeLa) oxide, and aluminum-cobalt-germanium-lanthanum (AlCoGeLa) oxide.

2. The display device of claim 1, wherein:
the oxide semiconductor includes at least one of an oxide including titanium (Ti), hafnium (Hf), zirconium (Zr), aluminum (Al), tantalum (Ta), germanium (Ge), zinc (Zn), gallium (Ga), tin (Sn), or indium (In).

3. The display device of claim 2, wherein:
the active layer has a thickness of 40 Å to 500 Å.

4. The display device of claim 1, wherein:
the thin film transistor comprises a gate electrode, and source/drain electrodes positioned on the gate electrode with a gate insulating layer interposed therebetween, and
the active layer is positioned between the source electrodes and the drain electrodes on the gate insulating layer.

5. The display device of claim 4, wherein:
an etching stopping layer is positioned on the active layer and the source/drain electrodes, and
the passivation layer is positioned on the etching stopping layer.

6. The display device of claim 5, wherein:
the hydrogen blocking layer is positioned between the etching stopping layer and the passivation layer.

7. The display device of claim 5, wherein:
the hydrogen blocking layer is directly on the active layer and the source/drain electrodes.

8. The display device of claim 5, wherein:
the hydrogen blocking layer comprises:
a first hydrogen blocking layer positioned between the etching stopping layer and the passivation layer; and
a second hydrogen blocking layer directly on the active layer and the source/drain electrodes.

9. The display device of claim 5, wherein:
the etching stopping layer includes silicon oxide, and
the passivation layer includes silicon nitride.

10. The display device of claims 4, further comprising:
a pixel electrode connected to the thin film transistor;
a second substrate disposed opposite to the substrate;
a common electrode formed on one surface of the second substrate facing the substrate; and
a liquid crystal layer positioned between the pixel electrode and the common electrode.

11. The display device of claim 1, wherein:
the thin film transistor comprises a gate electrode and source/drain electrodes; and the active layer is positioned on a gate insulating layer covering the gate electrode, an etching stopping layer is positioned on the active layer, and the source/drain electrodes are positioned on the etching stopping layer, and are connected to the active layer through a via hole formed in the etching stopping layer.

12. The display device of claim 11, wherein:

the passivation layer is positioned on the source/drain electrodes.

13. The display device of claim 12, wherein:

the hydrogen blocking layer is positioned between the source/drain electrodes and the passivation layer.

14. The display device of claim 12, wherein:

the hydrogen blocking layer comprises:
 a first hydrogen blocking layer positioned on the source/drain electrodes and the passivation layer; and
 a second hydrogen blocking layer positioned between the etching stopping layer and the source/drain electrodes, and is formed with a via hole together with the etching stopping layer.

15. The display device of claim 12, wherein:

the hydrogen blocking layer is positioned between the active layer and the etching stopping layer, and is formed with a via hole together with the etching stopping layer.

16. The display device of claim 12, wherein:

the hydrogen blocking layer comprises:
 a first hydrogen blocking layer positioned between the source/drain electrodes and the passivation layer; and
 a second hydrogen blocking layer positioned between the active layer and the etching stopping layer, and is formed with a via hole together with the etching stopping layer.

17. The display device of claim 12, wherein:

the etching stopping layer and the passivation layer include silicon oxide.

18. The display device of claim 11, further comprising:

an organic light emitting diode comprising a pixel electrode connected with the thin film transistor, an organic emission layer formed on the pixel electrode, and a common electrode formed on the organic emission layer; and an encapsulation member configured to seal the organic light emitting diode.

19. The display device of claim 18, wherein:

the substrate and the encapsulation member have a bending property.

20. The display device of claim 18, wherein:

the organic emission layer comprises a red organic emission layer, a green organic emission layer, and a blue organic emission layer, or comprises a white organic emission layer.

* * * * *